United States Patent
Masuda et al.

(10) Patent No.: US 6,188,086 B1
(45) Date of Patent: *Feb. 13, 2001

(54) LIGHT EMITTING DIODE ARRAY AND OPTICAL IMAGE FORMING APPARATUS WITH LIGHT EMITTING DIODE ARRAY

(75) Inventors: Kouji Masuda; Suzuki Seizo, both of Yokohama (JP)

(73) Assignee: Ricoh Company, Ltd., Tokyo (JP)

( * ) Notice: Under 35 U.S.C. 154(b), the term of this patent shall be extended for 0 days.

This patent is subject to a terminal disclaimer.

(21) Appl. No.: 09/351,171

(22) Filed: Jul. 12, 1999

Related U.S. Application Data

(63) Continuation of application No. 09/124,833, filed on Jul. 30, 1998, now Pat. No. 5,962,874, which is a continuation of application No. 08/744,311, filed on Nov. 7, 1996, now Pat. No. 5,838,024.

(30) Foreign Application Priority Data

Nov. 10, 1995 (JP) .................................................. 7-292575

(51) Int. Cl.⁷ .......................... H01L 33/00; H01L 31/062; H01L 31/113; H01L 21/00; G02B 9/00
(52) U.S. Cl. .............................. 257/98; 257/88; 257/95; 257/294; 359/738; 438/29
(58) Field of Search .................................. 257/88, 91, 95, 257/98, 99, 257, 294, 432, 436; 359/738; 438/29

(56) References Cited

U.S. PATENT DOCUMENTS

| | | | |
|---|---|---|---|
| 4,371,258 | * | 2/1983 | Mast ........................................ 355/37 |
| 4,654,629 | * | 3/1987 | Bezos et al. ....................... 246/473.3 |
| 4,791,494 | * | 12/1988 | Schaefer ................................ 358/300 |
| 4,922,218 | * | 5/1990 | Watanabe et al. .................... 136/261 |
| 5,070,369 | * | 12/1991 | Mahoney et al. ..................... 399/301 |
| 5,418,384 | * | 5/1995 | Yamana et al. ........................ 257/88 |
| 5,444,520 | * | 8/1995 | Murano ................................ 399/221 |
| 5,838,024 | | 11/1998 | Masuda et al. ......................... 257/98 |
| 5,962,874 | * | 10/1999 | Masuda et al. ......................... 257/98 |

* cited by examiner

Primary Examiner—Mahshid Saadat
Assistant Examiner—Allan R. Wilson
(74) Attorney, Agent, or Firm—Oblon, Spivak, McClelland, Maier & Neustadt, P.C.

(57) ABSTRACT

An image forming system utilizing a light emitting diode (LED array) having LEDs arranged along a curved line. The LEDs are either edge emitting type LEDs or surface emitting type LEDs. The LEDs of the LED array emit light towards a center or optical axis of the lens. A plurality of lenses are connected together to form a lens array. Alternatively, two lens arrays can be utilized. If two lens arrays are utilized, each of the lenses in the lens array includes an aspherical surface. The curved LED array prevents the flaring of light and produces an even pattern of light emission on a light receiving surface such as a photoconductive drum.

38 Claims, 6 Drawing Sheets

LIGHT EMITTING DIODE ARRAY AND OPTICAL IMAGE FORMING APPARATUS WITH LIGHT EMITTING DIODE ARRAY

This application is a continuation of application Ser. No. 09/124,833 filed on Jul. 30, 1998, now U.S. Pat. No. 5,962,874, which is a continuation of Ser. No. 08/744,311 filed Nov. 7, 1996, now U.S. Pat. No. 5,838,024.

BACKGROUND OF THE INVENTION

1. Field of the Invention

The present invention is directed to a light emitting diode (LED) array for optical printers, digital copiers, facsimile machines, etc. More particularly, the present invention is directed to a light emitting diode array in which a plurality of light emitting elements are disposed along a curved line in order to reduce distortion.

2. Discussion of the Background

A light emitting diode array includes a plurality of light emitting elements which are disposed in at least one row. Such a light emitting diode array is used in an optical printer, a digital copier, or a facsimile machine. The light emitting diode array is more reliable for use under vibrations and noises than a laser beam printer. The light emitting diode array is also suitable for miniaturizing an optical image forming apparatus, as the light emitting diode array does not need a scanning mechanism such as a polygonal mirror as is required by the laser beam printer.

FIG. 8 illustrates a base 80 having mounted thereon a conventional light emitting diode array 70 with two lens arrays 90 and 100 for use in an optical image forming apparatus. The light emitting diode array 70 comprises a plurality of light emitting diodes 71 which are disposed in one row and on a straight line at the same predetermined distance from each other. The straight line on which the light emitting diodes 71 are disposed is perpendicular to an optical axis of lenses 91 and 101 in the lens arrays 90 and 100.

A pattern of light emission from the light emitting diode array 70 is focused on a photosensitive body such as a photoconductive drum through the two lens arrays 90 and 100 so as to form an image on the photosensitive body. However, the above-mentioned optical image forming apparatus with light emitting diode array 70 and lens arrays 90 and 100 has a drawback in that light loss occurs at connecting portions 91a, 101a between each lens 91 and 101, and in that flared light occurs on each lens 91 and 101. As a result, a pattern of light emission onto the photosensitive body becomes uneven.

SUMMARY OF THE INVENTION

Accordingly, the present invention provides for a novel light emitting diode array which can solve the aforementioned drawbacks, and, thus, an object of the present invention is to provide for a novel light emitting diode array in which a pattern of light emission onto the photosensitive body from the light emitting diode array and the lens array is uniform.

It is another object of the present invention to provide for a novel light emitting diode array in which the occurrence of light loss and flared light is prevented.

These and other objects are accomplished by a light emitting diode array for use in an optical image forming apparatus which has the LEDs arranged along a curved line. Light from the LEDs along the curved line is focused through a lens on a light receiving surface such as a photoconductive drum. This forms a latent image on the photoconductive drum which can be developed using conventional toner developing techniques into a toner image which is transferred onto a page in a conventional manner. The LEDs are edge emitting type LEDs or alternatively surface emitting type LEDs. The LEDs at the ends of the LED array are aimed toward and project light towards the center of the lens and also towards the optical axis of the lens.

The lens used by the present invention can include one lens array or two lens arrays in parallel. If two lens arrays are used, each of the lenses include an aspherical surface. The arrangement of the invention can be used in an image forming system such as a copier, printer, or facsimile machine.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
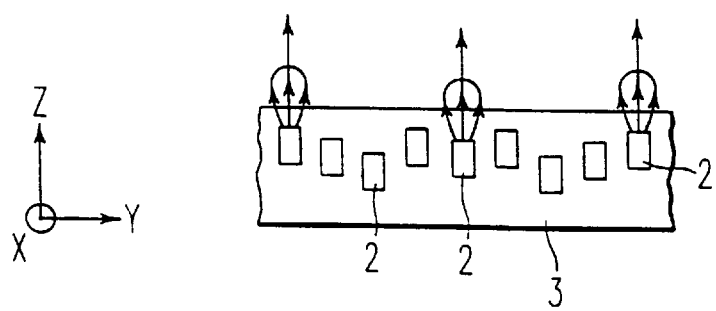
FIGS. 1A and 1B are views showing the construction of an edge emitting type light emitting diode array in accordance with the present invention.

Preferred embodiments of a light emitting diode array and an optical image forming apparatus with the light emitting diode (LED) array in accordance with the present invention will now be explained with reference to the accompanying drawings, wherein like reference numerals are utilized to designate identical or corresponding elements throughout the several views.

Figure 1B:
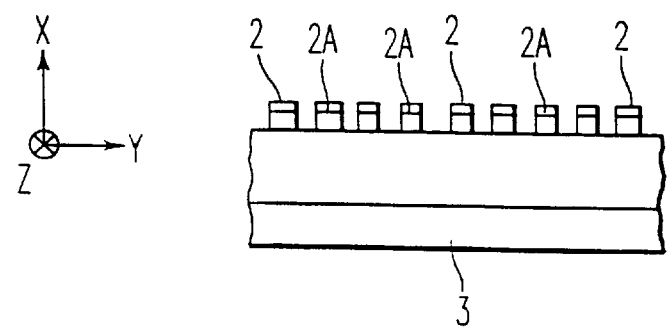

FIGS. 1A and 1B are views showing the construction of an edge emitting type light emitting diode array in accordance with the present invention. Light emitting diodes 2 with light emitting elements 2A are provided on a base 3. The light emitting diode array has a plurality of light emitting diodes 2 which are disposed on a curved line with a same predetermined distance between each LED 2. The Z direction is a light emitting direction, and the Y direction is a direction of a rotating axis of the photosensitive body.

Figure 2A:
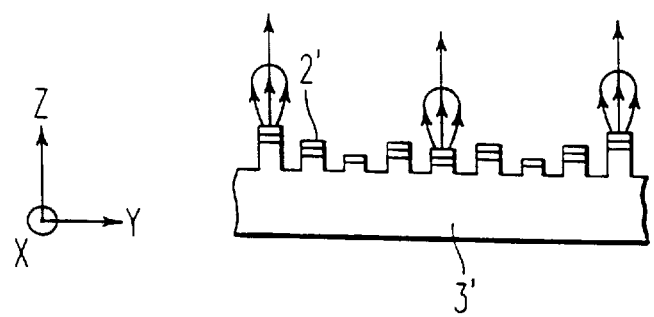
FIGS. 2A and 2B are views showing the construction of a surface emitting type light emitting diode array in accordance with the present invention.
Figure 2B:
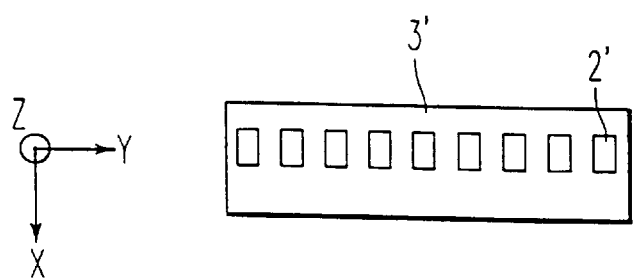

FIGS. 2A and 2B are views showing the construction of a surface emitting type light emitting diode array in accordance with the present invention. A plurality of light emitting diodes 2' are provided on a base 3'. The light emitting diode array has a plurality of light emitting diodes 2' which are disposed on a curved line at a same predetermined distance from each other.

The edge emitting type LED array in FIG. 1 and the surface emitting type LED array in FIG. 2 are manufactured using a semiconductor forming process such as the LPE (Liquid Phase Epitaxial) method or the MOCVD (Metal Organized Chemical Vapor Deposit) method. The edge emitting type light emitting diode array is more easily manufactured than the surface emitting type LED array.

Figure 3:
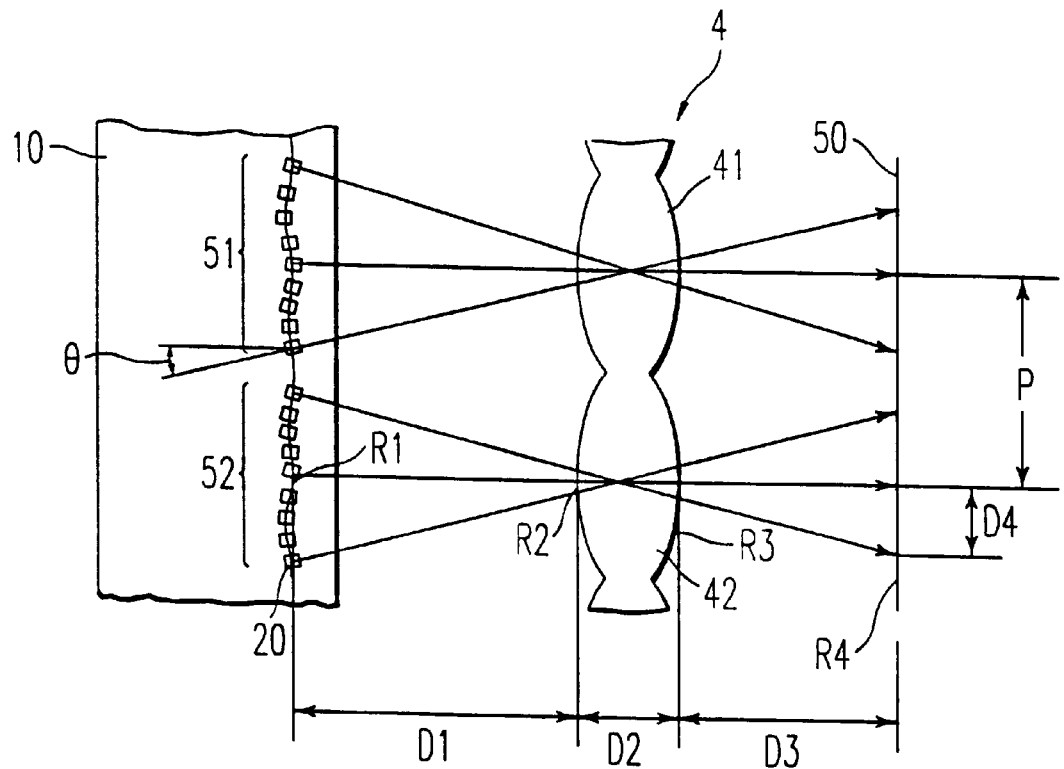
FIG. 3 is a view showing the first embodiment of the light emitting diode array with a lens array for an optical image forming apparatus in accordance with the present invention.
Figure 4:
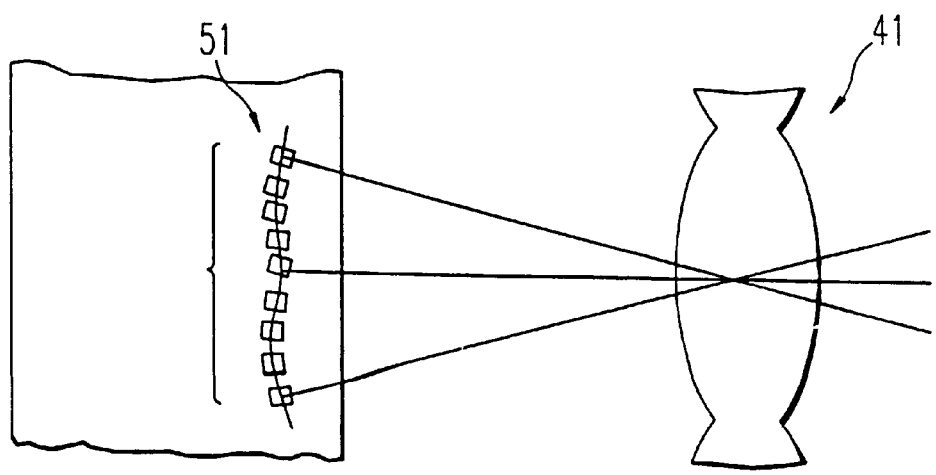
FIG. 4 is a view showing an enlargement of the light emitting diode array with the lens array of FIG. 3.

FIG. 3 is a view showing the first embodiment of the light emitting diode array having a lens array for the optical image forming apparatus in accordance with the present invention, and FIG. 4 is an enlarged view of FIG. 3. It is to be noted that the elements illustrated in FIGS. 3 and 4 can correspond to similarly named elements in FIGS. 1A, 1B, 2A, and 2B. As illustrated in FIGS. 3 and 4, the light emitting diode arrays 51 and 52 have a plurality of light emitting diodes 20 which are disposed on a curved line at a same predetermined distance from each other on a base 10. The light emitting diode arrays 51 and 52 correspond to aspherical lenses 41 and 42 of a lens array 4. The lens array 4 focuses the light from the LED array 51 to a photosensitive body 50. The distance between the optical axes of lenses 41 and 42 are a predetermined distance P. In FIG. 3, the "R" values represent a radius of specific curvature and the "D" values represent a distance. Numeric values of the R and D values are provided below with respect to the first embodiment.

Luminous flux is emitted from the light emitting diode located at the end of the light emitting diode array 51 closest to the array 52 towards the optical axis of lens 41 at an angle 0 (and consequently towards the optical axis of the lens 41) onto the photosensitive body 50 so that amounts of the luminous flux from each of the diodes 20 of the array 51 to the lens 41 are equal.

As can be seen in FIGS. 1A, 2A, and 3, a direction of emission of light from the LEDs and a curved line connecting the LEDs are generally planar. For example, in FIG. 1A, the line connecting the LEDs is in the ZY plane and the light from the LEDs is also in the ZY plane. Additionally, in FIG. 2A, the curve connecting the LEDs is in the ZY plane and the direction of emission of the LEDs is also in the ZY plane.

The curved line of the light emitting diode array 51 and the aspherical surface of the lens 41 are explained herein. In the following description for the aspherical surface, an x-coordinate is set to be in conformity with the optical axis of the lens, and an h-coordinate is set to be perpendicular to the optical axis of the lens.

In the equation set forth below, r designates a radius of curvature of a surface on the optical axis, k designates a conical constant, and a, b, c and d designate aspherical coefficients of higher orders. In this case, as is well known, the aspherical surface is provided by a curved surface obtained by rotating a curve represented by the following formula around the optical axis of the lens.

$$z=(h^2/r)/[1+\sqrt{\{1-k)(h/r)^2\}}]+a \cdot h^4+b \cdot h^6+c \cdot h^8+d \cdot h^{10} + \quad (1)$$

A shape of the aspherical surface is specified by providing the radius of curvature on the optical axis of the lens, the conical constant and the aspherical coefficients of higher orders.

With respect to the aspherical coefficients, E and a number subsequent to this E designate a power. For example, E-9 shows $1/10^9$ and this value $1/10^9$ is multiplied by a numerical value which appears before the E.

In the following description for the curved line U on which the group of light emitting diodes for a respective lens is disposed, a y-coordinate is set to be in conformity with the arranging direction of the light emitting diode array. In the equation below, reference characters L, K, A, B, C and D designate coefficients.

$$U=(Y^2/L)/[1+\sqrt{\{1-(1+K)(Y/L)^2\}}]+A \cdot Y^4+B \cdot Y^6+C \cdot Y^8+D \cdot Y^{10} + \quad (2)$$

The shape of the curved line is defined by the coefficients of equation (2). As equation (2) has a similar format to equation (1) and equation (1) defines an aspherical curve, equation (2) also defines an aspherical curve.

In FIG. 3, the curved line of the LED array 51 includes several inherent features. The curved line contains three points at which the first derivative is zero, and two points of inflection. The definition of a point of inflection is a point at which there is a change in curvature of a curve from concave to convex or conversely. Further, the curved line of the LED array 51 contains a total of 5 maxima and minima.

First Embodiment

Below are parameters of a first exemplary embodiment of the invention, as illustrated in FIG. 3.

TABLE I

| Object | Radius (mm) | Index of Refraction |
|---|---|---|
| Diode Array | 1.469E-4 | 1.0 |
| 1st Lens Surface | 4.034 | 1.5721 |
| 2nd Lens Surface | -83.729 | 1.0 |
| Photosensitive Body | ∞ | N/A |

D1=13.0 mm
D2=6.40 mm
D3=10.52 mm
D4=2.71
Parameters of the Aspherical Surface of the 1st Lens Surface:
r=4.034, k=0.2224,
a=-1.5650E-3, b=-1.2677E-4,
c=1.3081E-5, d=-1.5695E-6
Parameters of the Aspherical Surface of the 2nd Lens Surface:
r=-83.729, k=-583.6955,
a=3.5363E-3, b=3.8881E-4,
c=-2.364E-5, d=5.3886E-6
Parameters of the Curve Line:
L=1.469E-4, K=-444.7470,
A=-2.2664E-2, B=5.2473E-3,
C=-1.3095E-4, D=-3.7272E-5
Other parameters of the lenses are as follows:
Focal length: 6.91 mm
Brightness of lens (F No): 3.27
Valid diameter: 5.37 mm
Distance between each lens P: 5.47 mm
Lateral magnification: -1.10

When the image resolution is 600 dots per inch, the number of light emitting diodes in the array for each lens is lens 128 per 5.47 mm.

Figure 5C:
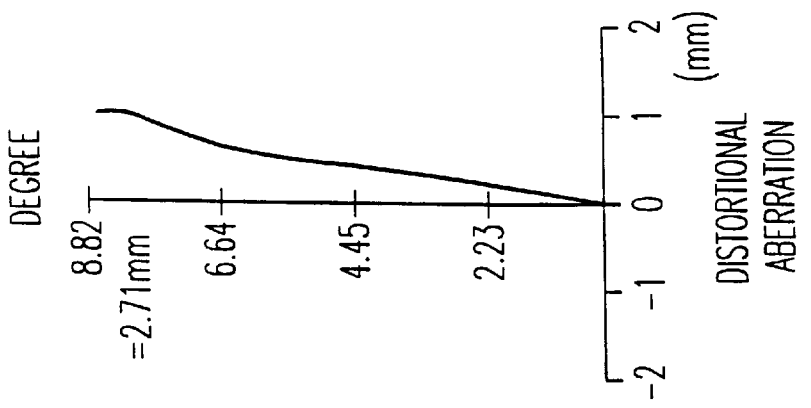
FIGS. 5A, 5B, and 5C are diagrams of spherical aberration, astigmatism and distortional aberration, respectively, of the first embodiment of the light emitting diode array with the lens array for the optical image forming apparatus in accordance with the present invention.
Figure 5B:
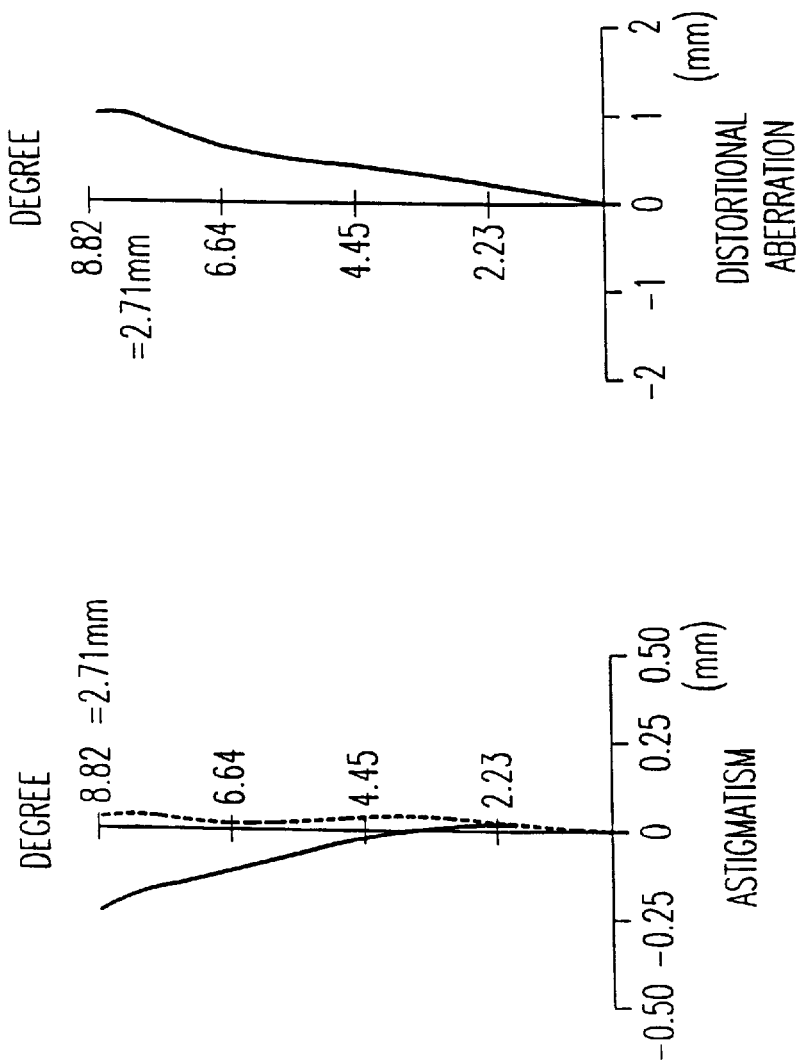
Figure 5A:
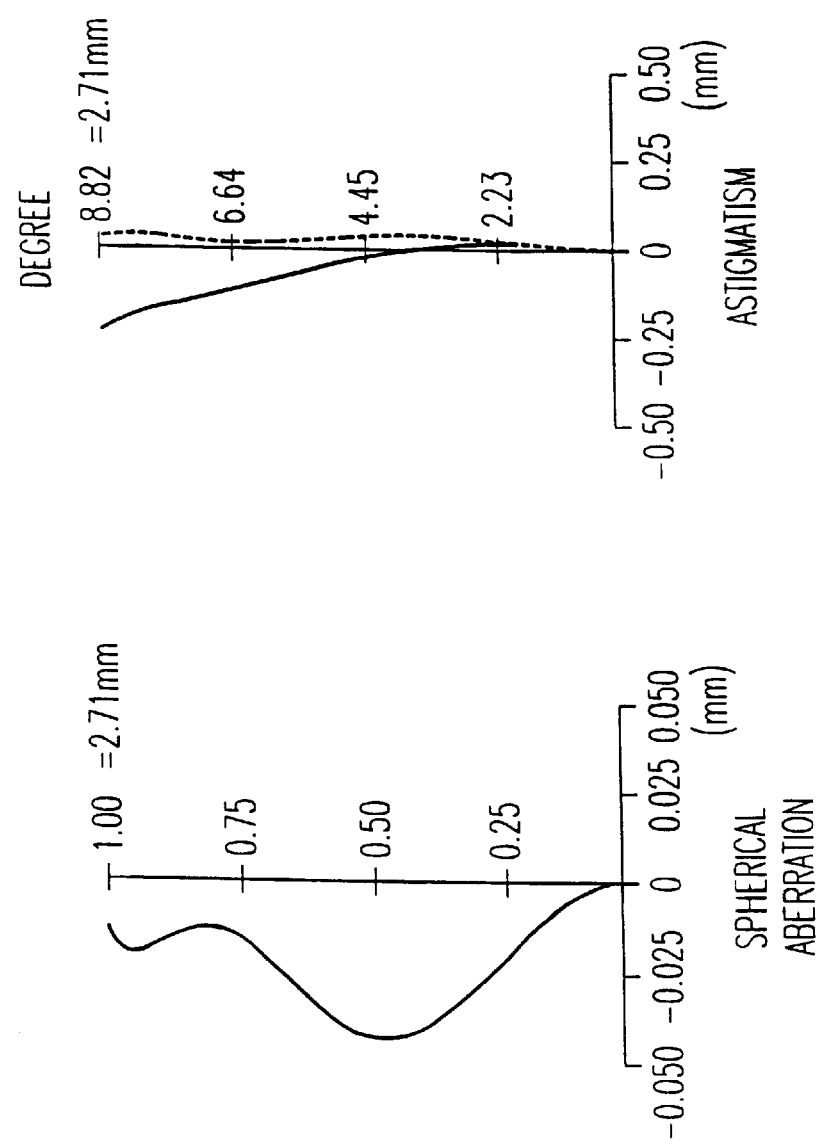

FIGS. 5A–5C are diagrams of spherical aberration, astigmatism and distortional aberration of the first embodiment of the light emitting diode array and the lens array for the optical image forming apparatus in accordance with the present invention.

In FIG. 5B, the broken (dashed) line represents the astigmatism along the meridional direction (the array arranging direction) and the solid line represents the astigmatism along the sagittal direction which is the direction perpendicular to the array arranging direction. In FIG. 5B, the dashed line is close to the vertical axis, thus indicating that this embodiment obtains a reduced meridional astigmatism.

Figure 6:
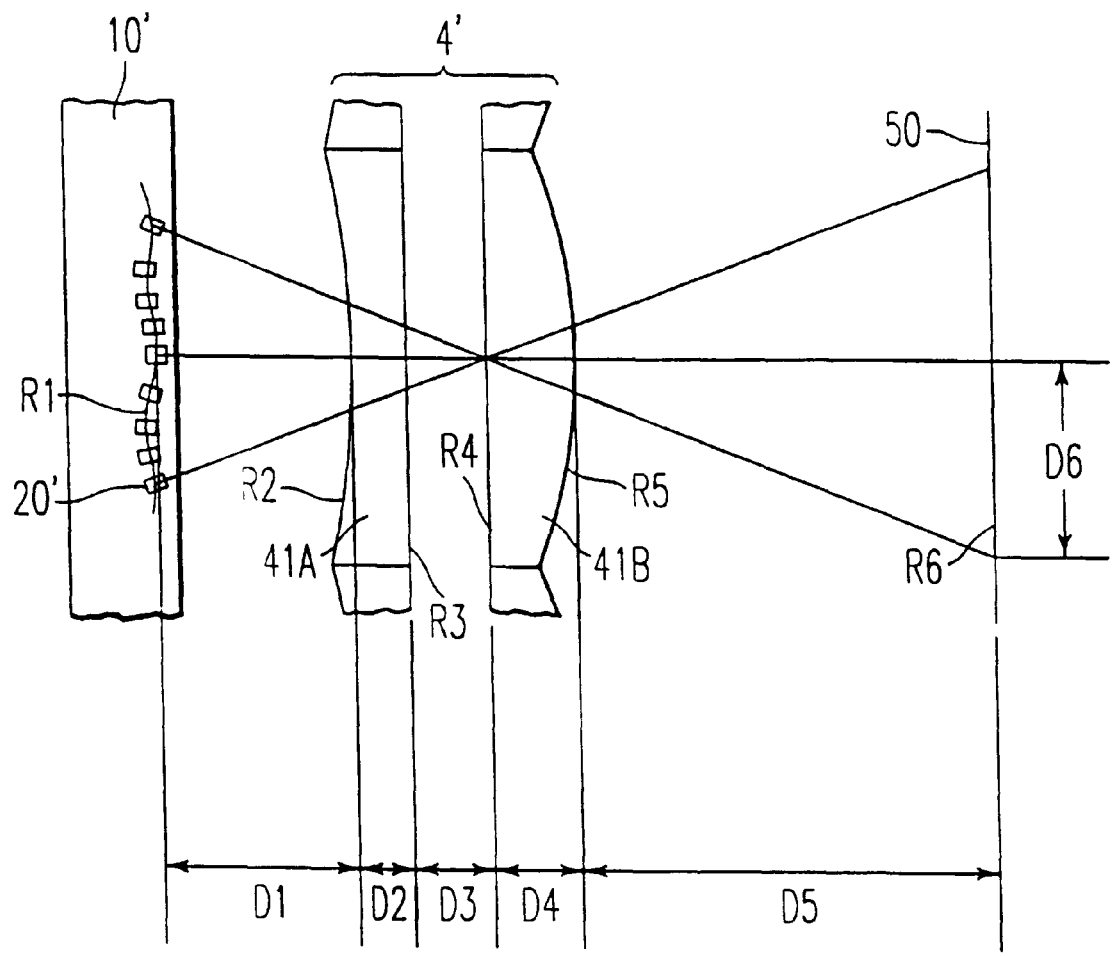
FIG. 6 is a view showing the second embodiment of the light emitting diode array with two lens arrays for the optical image forming apparatus in accordance with the present invention.

FIG. 6 is a view showing the second embodiment of the light emitting diode array with two lens arrays for the optical image forming apparatus. As illustrated in FIG. 6, a light emitting diode 20' is provided on the base 10'. The light emitting diode array has a plurality of light emitting diodes which are disposed on a curved line at a same predetermined distance from each other. The light emitting diode array corresponds to two aspherical lenses 41A and 41B of a lens array 4'. Luminous flux is emitted from the light emitting diode 20' located at a lowermost edge of the light emitting array toward the center of the two lenses 41A and 41B (and consequently towards their optical axes) onto the photosensitive body 50.

The curved line for the light emitting diode array and the aspherical surface of two lenses 41A and 41B are explained hereinafter.

Second Embodiment

Below are parameters of a second exemplary embodiment of the invention as illustrated in FIG. 6.

TABLE II

| Object | Radius (mm) | Index of Refraction |
|---|---|---|
| Diode Array | −1.958E−8 | 1.0 |
| 1st Lens Surface | −29.847 | 1.5721 |
| 2nd Lens Surface | ∞ | 1.0 |
| 3rd Lens Surface | ∞ | 1.5721 |
| 4th Lens Surface | −4.661 | 1.0 |
| Photosensitive Body | ∞ | N/A |

D1=11.00 mm
D2=2.50 mm
D3=2.00 mm
D4=2.5 mm
D5=20.00 mm
D6=2.71 mm
Spherical Surface of 1st Lens Surface:
r=−29.847, k=−504.7168,
a=−3.4307E−3, b=−1.8331E−4,
c=−5.6715E−5, d=1.1841E=5
Aspherical Surface of 4th Lens Surface:
r=−4.661, k=−1.2592,
a=6.3732E−4, b=−1.6292E−4,
c=−1.5340E−5, d=2.3309E−6
Curved Line:
L=−1.958E−8, K=−7.1770E+12
A=2.6166E−2, B=−1.2259E−2,
C=1.2925E−3, D=2.3840E−5
Focal length: 8.64 mm
Brightness of lens (F No): 3.67
Valid diameter: 5.40 mm
Distance between each lens P: 5.69 mm
Lateral magnification: −1.10

When the image resolution is 600 dots per inch, the number of light emitting diodes in the array is 134 per 5.69 mm.

Figure 7A:
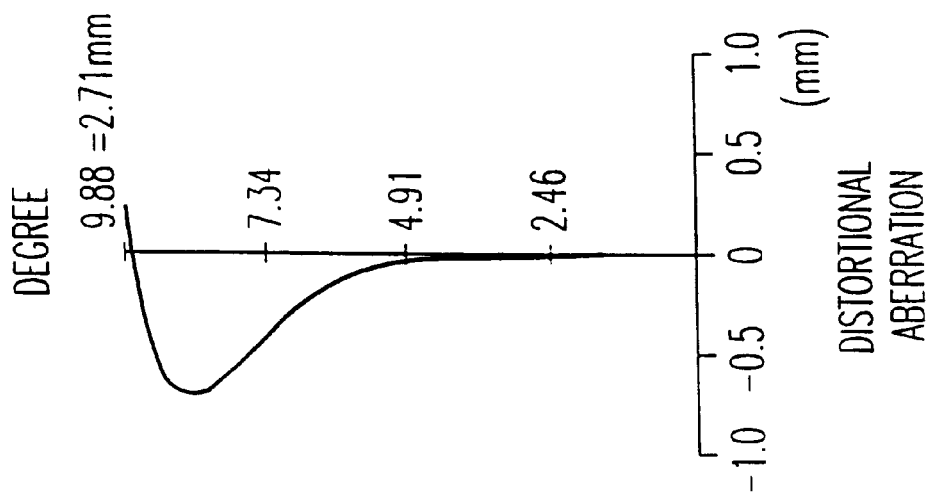
FIGS. 7A, 7B, and 7C are diagrams of spherical aberration, astigmatism and distortional aberration, respectively, of the second embodiment of the light emitting diode array with two lens arrays for the optical image forming apparatus in accordance with the present invention.
Figure 7B:
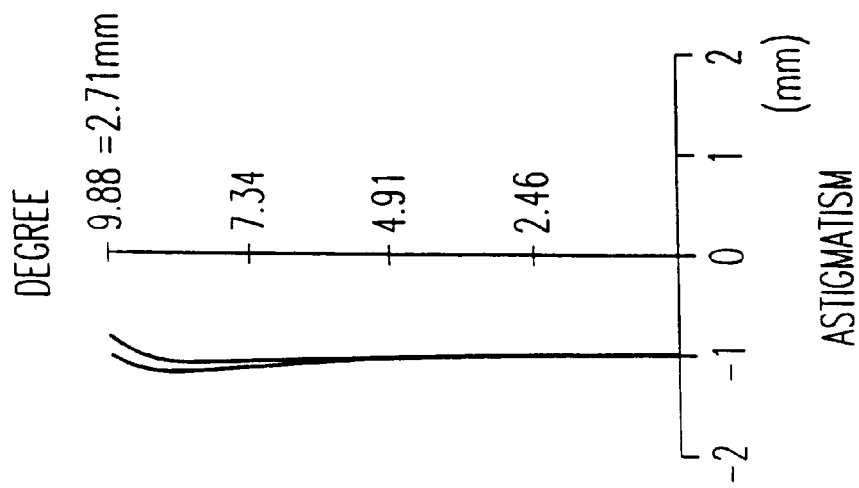
Figure 7C:
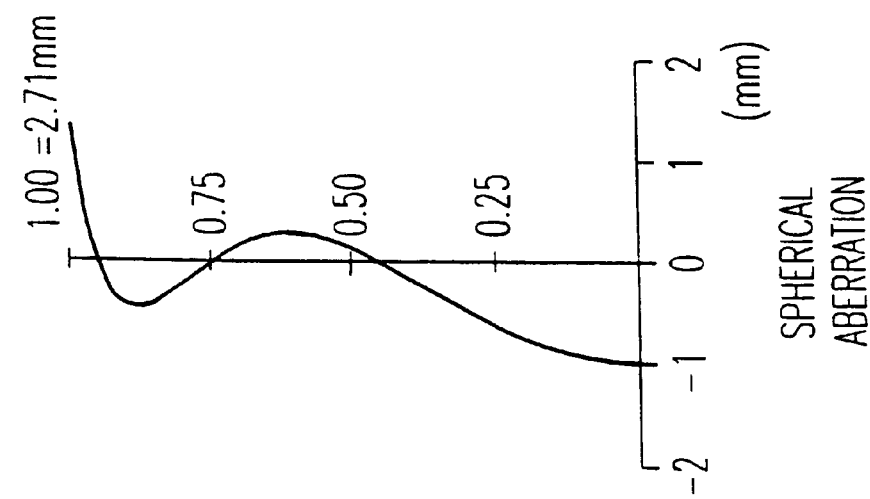
Figure 8:
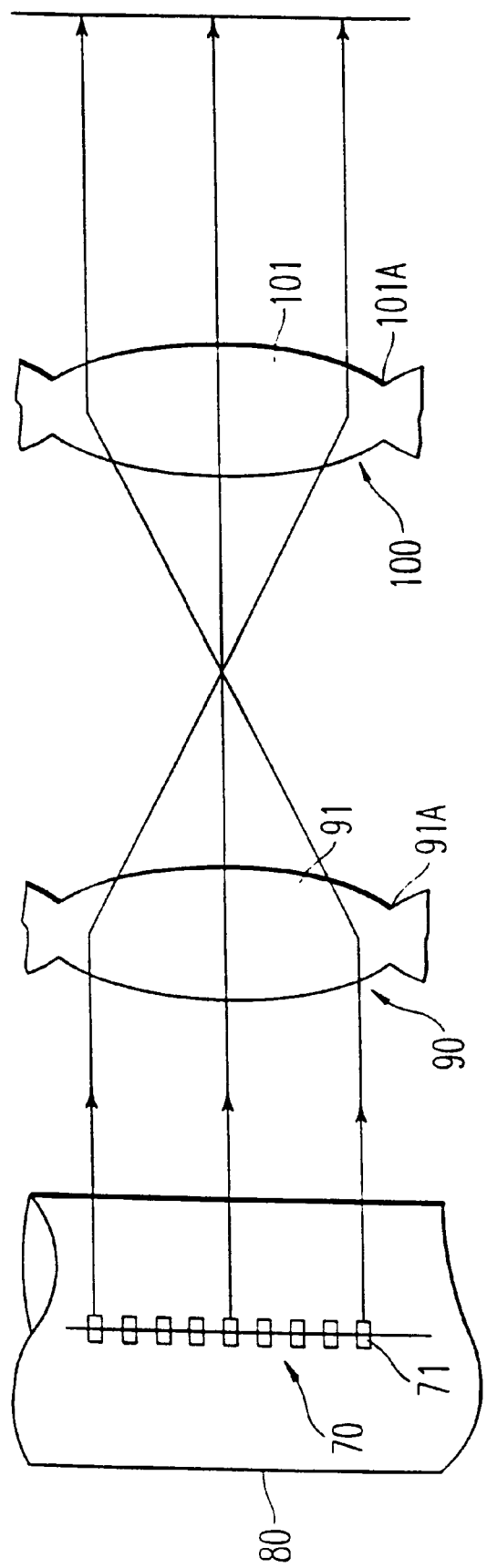
FIG. 8 is a view showing a conventional light emitting diode array with lens array for the optical image forming apparatus.

FIGS. 7A–7C are diagrams of spherical aberration, astigmatism, and distortional aberration, respectively, of the second embodiment of the light emitting diode array with two lens arrays for the optical image forming apparatus in accordance with the present invention. In these Figures, the astigmatism in the meridional direction, corresponding to the broken line in FIG. 7B and the distortional aberration illustrated in FIG. 7C are improved by arranging the LEDs on the curved line.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An image forming system, comprising:
   a light emitting diode, "LED," array having LEDs disposed thereon along a curved line, each of the LEDs forming the curved line, and a direction of emission of the LEDs and the curved line being generally planar;
   a light sensitive element; and
   a lens which focuses light emitted from the LEDs to the light sensitive element.

2. A system according to claim 1, wherein the system comprises at least one of a facsimile machine, a printer, and a copier.

3. A system according to claim 1, wherein:
   the light sensitive element comprises a photoconductive drum.

4. A system according to claim 1, wherein:
   the LED array includes edge emitting type LEDs.

5. A system according to claim 1, wherein:
   the LED atray includes surface emitting type LEDs.

6. A system according to claim 1, wherein:
   the LEDs of the LED array emit light towards an optical axis of the lens.

7. A system according to claim 1, wherein:
   the lens includes two aspherical surfaces.

8. A system according to claim 1, further comprising:
   a second lens which receives light from the first lens and focuses light from the first lens onto the light sensitive element.

9. A system according to claim 8, wherein:
   each of the lenses includes an aspherical surface.

10. A system according to claim 1, wherein:
    the curved line is an aspherical line.

11. A system according to claim 1, wherein:
    the lens has at least one curved surface which is an aspherical surface.

12. A system according to claim 11, wherein:
    the curved line which is an aspherical line is arranged to reduce an astigmatism of the system and the curved surface which is an aspherical surface is arranged to reduce aberrations.

13. A system according to claim 1, wherein:
    the curved line has LEDs at ends thereof aimed at angles towards a center of the lens.

14. A system according to claim 1, wherein:
    an LED at a center of the LED array is aimed towards a center of the lens.

15. A system according to claim 14, wherein:

the curved line has LEDs at ends thereof aimed at angles towards a center of the lens.

16. A system according to claim 1, wherein:

the array is parallel to an axis of rotation of the light sensitive element.

17. A system according to claim 1, wherein:

the curved line has two inflection points.

18. A system according to claim 17, further comprising:

a first axis parallel to a rotating axis of the light sensitive element; and a second axis perpendicular to the first axis, wherein the curved line has at least a total of five local minima and maxima relative to the second axis.

19. A system according to claim 1, wherein:

the curved line comprises three points at which a first derivative of the line is zero.

20. An image forming system, comprising:

an LED, Light Emitting Diode, array means having LEDs disposed thereon along a curved line, each of the LEDs forming the curved line, the LED array means for emitting light, and a direction of emission of the LEDs and the curved line being generally planar;

photosensitive means for being sensitive to light; and lens means for focusing light emitted from the LEDs to the photosensitive means.

21. A system according to claim 20, wherein the system comprises at least one of a facsimile machine, a printer, and a copier.

22. A system according to claim 20, wherein:

the photosensitive means comprises a photoconductive drum.

23. A system according to claim 20, wherein:

the LED array means includes edge emitting type LED means.

24. A system according to claim 20, wherein:

the LED array means includes surface emitting type LED means.

25. A system according to claim 20, wherein:

the LEDs of the LED array means emit light towards an optical axis of the lens means.

26. A system according to claim 20, wherein:

the lens means includes two aspherical surfaces.

27. A system according to claim 20, further comprising:

a second lens means which receives light from the first lens means and focuses light from the first lens means onto a light receiving means.

28. A system according to claim 27, wherein:

each of the lense means includes an aspherical surface.

29. A system according to claim 20, wherein:

the curved line is an aspherical line.

30. A system according to claim 29, wherein:

the lens means has at least one curved surface which is an aspherical surface.

31. A system according to claim 30, wherein:

the curved line which is an aspherical line is arranged to reduce an astigmatism of the system and the curved surface which is an aspherical surface is arranged to reduce aberrations.

32. A system according to claim 20, wherein:

the curved line has LEDs at ends thereof aimed at angles towards a center of the lens means.

33. A system according to claim 20, wherein:

an LED means at a center of the LED array means is aimed towards a center of the lens means.

34. A system according to claim 33, wherein:

the curved line has LED means at ends thereof aimed at angles towards a center of the lens means.

35. A system according to claim 20, wherein:

the LED array means is parallel to an axis of rotation of the photosensitive means.

36. A system according to claim 20, wherein:

the curved line has two inflection points.

37. A system according to claim 36, further comprising:

a first axis parallel to a rotating axis of the photosensitive means; and a second axis perpendicular to the first axis, wherein the curved line has at least a total of five local minima and maxima relative to the second axis.

38. A system according to claim 37, wherein:

the curved line comprises three points at which a first derivative of the line is zero.

* * * * *

UNITED STATES PATENT AND TRADEMARK OFFICE
CERTIFICATE OF CORRECTION

PATENT NO. : 6,188,086
DATED : February 13, 2001
INVENTOR(S) : Kouji MASUDA, et al.

It is certified that error appears in the above-identified patent and that said Letters Patent is hereby corrected as shown below:

On the Title page, Item (75), the 2nd Inventor's name is listed incorrectly. Item (75) should read as follows:

-- (75) Inventors: Kouji Masuda; Seizo Suzuki, both of Yokohama (JP)

Signed and Sealed this

Fifth Day of June, 2001

*Attest:*

*Attesting Officer*

NICHOLAS P. GODICI
*Acting Director of the United States Patent and Trademark Office*